United States Patent
Boardman et al.

(10) Patent No.: US 11,322,707 B2
(45) Date of Patent: May 3, 2022

(54) CADMIUM-FREE QUANTUM DOT LED WITH IMPROVED EMISSION COLOR

(71) Applicant: Sharp Kabushiki Kaisha, Osaka (JP)

(72) Inventors: Edward Andrew Boardman, Oxford (GB); Enrico Angioni, Oxford (GB); Tim Michael Smeeton, Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 17/016,833

(22) Filed: Sep. 10, 2020

(65) Prior Publication Data

US 2020/0411786 A1    Dec. 31, 2020

Related U.S. Application Data

(63) Continuation-in-part of application No. 16/260,940, filed on Jan. 29, 2019, now abandoned.

(51) Int. Cl.
*H01L 51/50* (2006.01)
*H01L 51/52* (2006.01)
*H01L 27/32* (2006.01)

(52) U.S. Cl.
CPC ........ *H01L 51/502* (2013.01); *H01L 27/3246* (2013.01); *H01L 51/5072* (2013.01); *H01L 51/5253* (2013.01); *H01L 2251/303* (2013.01)

(58) Field of Classification Search
CPC ....... H01L 33/0004–648; H01L 33/504; H01L 51/5016; H01L 2933/0041;
(Continued)

(56) References Cited

U.S. PATENT DOCUMENTS

2007/0120453 A1    5/2007  Hwang
2008/0218068 A1    9/2008  Cok
(Continued)

FOREIGN PATENT DOCUMENTS

EP          3144972         3/2017
WO      WO 2017201982       11/2017

*Primary Examiner* — Cuong B Nguyen
(74) *Attorney, Agent, or Firm* — Renner, Otto, Boisselle & Sklar, LLP

(57) ABSTRACT

A light-emitting device is configured to emit light in improved accordance with the Rec. 2020 specification. The light emitting device includes a substrate; a first electrode disposed on the substrate between an outer surface of the light emitting device and the substrate; a second electrode disposed between the first electrode and the outer surface; a first emissive layer in electrical contact with the first electrode and the second electrode, wherein the first emissive layer includes quantum dots that emit light when electrically excited, and wherein the first emissive layer is associated with a first peak wavelength, $\lambda_1$; and a second emissive layer disposed between the first emissive layer and a viewing side of the light emitting device, wherein the second emissive layer is a photoluminescent layer that includes quantum dots that emit light when optically excited, and the second emissive layer is associated with a second peak wavelength, $\lambda_2$, different from the first peak wavelength. The second emissive layer operates to convert a portion of light emitted by the first emissive layer from the first peak wavelength to the second peak wavelength, such that the resultant overall emission is in accordance with the Rec. 2020 specification.

16 Claims, 12 Drawing Sheets

(58) Field of Classification Search
CPC ..... H01L 29/122–127; H01L 29/66439; H01L 29/66469; H01L 29/775; H01L 29/803; H01L 31/035209–035227; H01L 33/04–06; H01L 49/006; H01L 51/502; H01L 27/3246; H01L 51/5072; H01L 51/5253; H01L 2251/303; H01L 27/3209; H01L 27/322; H01L 51/504; H01L 51/5044; H01L 33/44–465; H01L 2933/0025; Y10S 977/755–772
See application file for complete search history.

(56) References Cited

U.S. PATENT DOCUMENTS

| | | |
|---|---|---|
| 2017/0166807 A1 | 6/2017 | Kuzumoto et al. |
| 2017/0236866 A1 | 8/2017 | Lee et al. |
| 2018/0019371 A1* | 1/2018 | Steckel ................ H01L 27/156 |

* cited by examiner

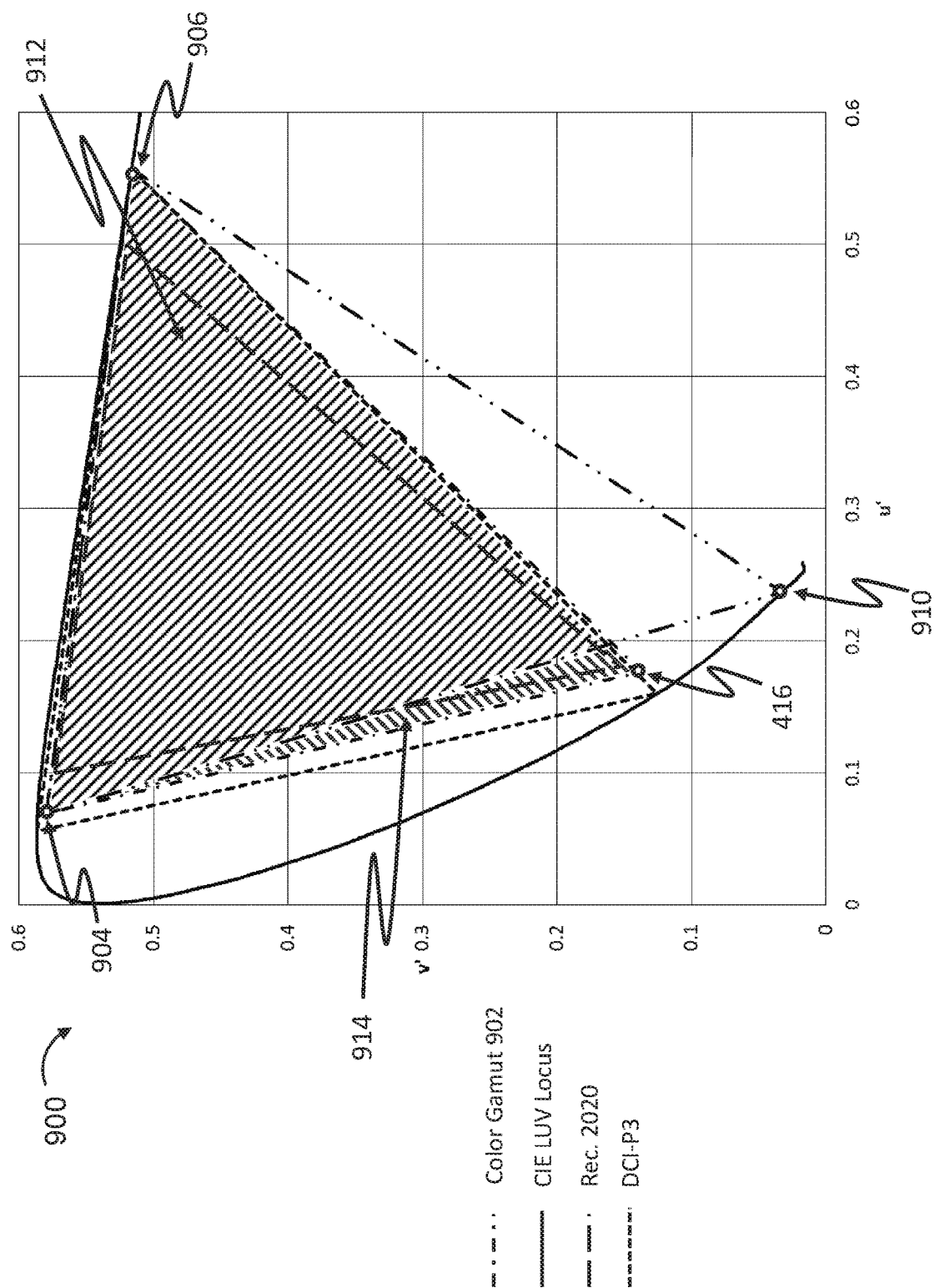

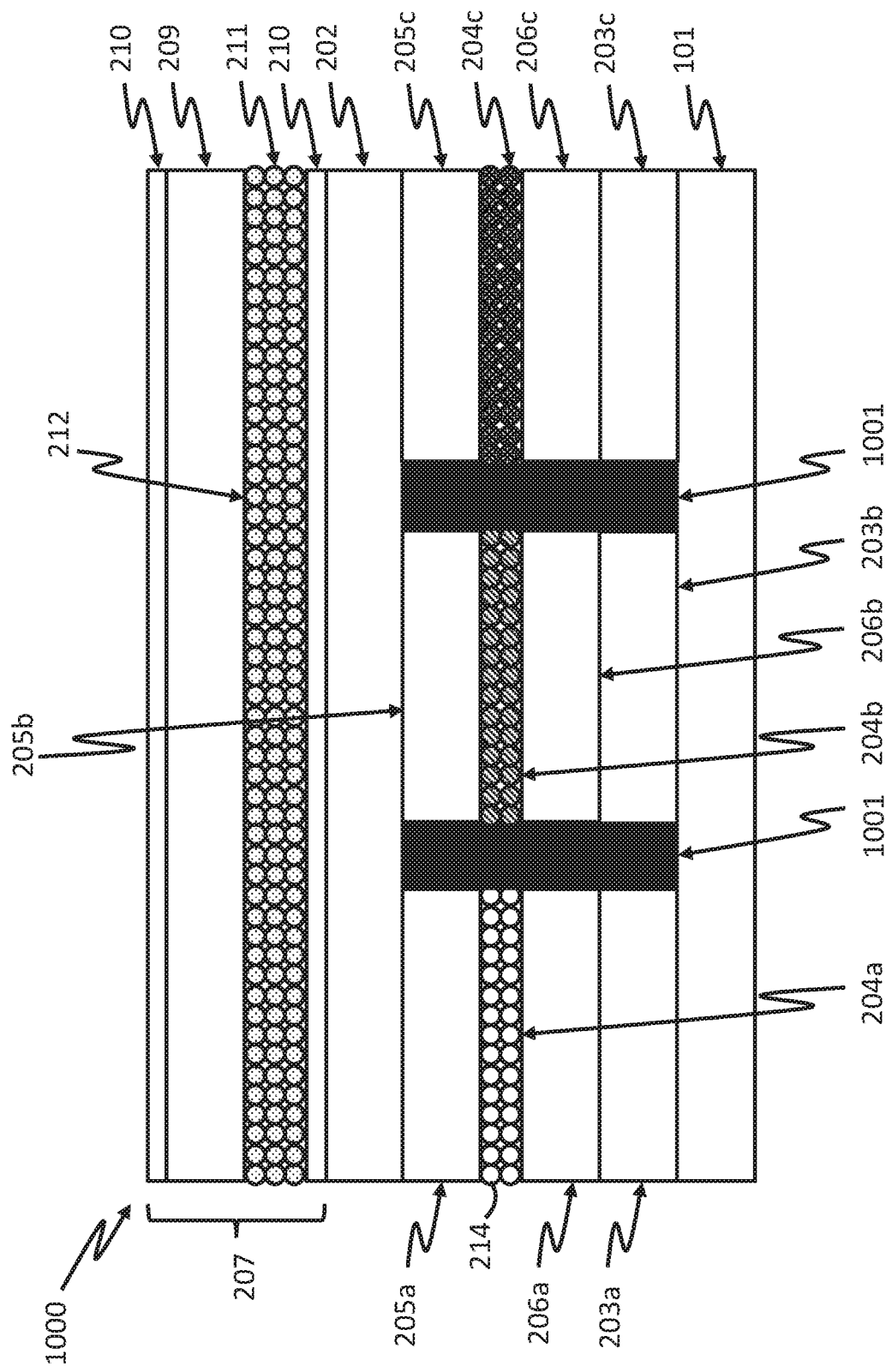

CADMIUM-FREE QUANTUM DOT LED WITH IMPROVED EMISSION COLOR

RELATED APPLICATIONS

This application is a continuation-in-part of U.S. application Ser. No. 16/260,940, filed on Jan. 29, 2019.

TECHNICAL FIELD

The present invention relates to a quantum dot light emitting device (QD-LED) and, more specifically, to a structure for a QD-LED that does not contain toxic materials and exhibits an improved color coordinate for a blue sub-pixel in a display.

BACKGROUND ART

A quantum dot light-emitting diode (referred to as a QD-LED, QLED or ELQLED) is a light-emitting device in which light is emitted due to the recombination of an electron and a hole on a quantum dot. Quantum dots are composed of inorganic materials, and therefore are expected to offer benefits when compared to existing technology which uses organic light emitting diodes (OLEDs). In addition to the expected benefits of longer lifetime, the ability of QD-LEDs to be operated at higher current densities (thereby achieving higher luminance values), and being more readily solution-processable, the emitted light from quantum dots covers a narrower range of wavelengths, which produces more saturated colors.

Display devices typically include three colors of sub-pixels within each pixel: one which emits red light, one which emits green light, and one which emits blue light. The wavelengths of light which make up the spectrum of the light emitted from each sub-pixel may be described using a pair of coordinates, for example x and y coordinates in the CIE 1931 XYZ color space, or u' and v' coordinates in the CIE 1976 LUV color space. The coordinates of the color of the three sub-pixels plotted together define the color gamut of the display device.

To ensure that images displayed on one display device look the same as an image displayed on another display device, various industry standards and accepted conventions have been developed and used over time, such as NTSC, Rec. 709 (also used for sRGB) and DCI-P3. These standards define the color coordinates for the emission of red, green and blue light from the display device, known as "primaries". To achieve good color reproduction, the spectrum of light emitted from the pixels of the display device must be capable of reaching the color coordinates of the standard's primaries, whether by emission from a single sub-pixel or a combination of emission from two or three sub-pixels.

Recommendations for future display standards have been made by the International Telecommunication Union, which are known as Rec. 2020 and Rec. 2100. Both of these recommended standards use the same definition for the color coordinates of the primaries, with the red primary corresponding to monochromatic 630 nm light, the green primary corresponding to monochromatic 532 nm light, and the blue primary corresponding to monochromatic 467 nm light. To that end, close-to-monochromatic light conventionally has been achievable from laser light sources. Display devices using laser light sources, however, are inefficient and expensive due to their complexity. For example, laser speckle caused by the coherency of the laser light must be mitigated or removed using additional optical components.

Therefore, systems and methods for an improved quantum dot display device that can reproduce colors close to the primaries of Rec. 2020 without using lasers is needed. The narrow emission spectrum from quantum dots makes QD-LEDs a potential candidate for such a display technology. Conventional materials which are commonly used in a QD-LED to emit blue light are:

1. $Cd_xZn_{1-x}Se_yS_{1-y}$, where $0<x \leq 1$ and $0 \leq y \leq 1$. These materials are undesirable because they contain the highly toxic metal cadmium.

2. ZnSe/ZnS. This material does not contain highly toxic elements and has very narrow emission, but the emission wavelength is limited to a maximum of around 440 nm, which is significantly shorter than the Rec. 2020 blue primary wavelength of 467 nm.

3. Perovskites of the form $CsPbX_3$, where X is a halide ion. These materials have very narrow emission but contain the highly toxic metal lead. Lead-free perovskites have very low efficiency and lifetimes when operated electrically, making them unsuitable for use in displays.

Various conventional methods for manipulating the perceived color of blue light to a more favorable color coordinate have been used. For example, US 2017/0236866 (Lee et al., published Aug. 17, 2017) describes the use of a phosphor, which may include quantum dots, on top of an LCD backlight unit which emits blue light. Lee describes a phosphor that can include quantum dots. The phosphor converts a small amount of the blue light (wavelength between 400 nm and 500 nm) into green light (wavelength between 500 nm and 600 nm) while leaving the rest of the blue light to pass through the phosphor without changing its color.

WO 2017/201982 (Xiao et al., published Nov. 30, 2017) describes the use of down converting particles disposed in a transparent matrix, which are capable of converting light in a wavelength range of 380 nm-430 nm into light in a wavelength range of 430 nm-470 nm. The transparent matrix may additionally include light scattering particles to change the angular distribution of light emitted by the light-emitting device.

EP 3144972 (Hack et al., published Mar. 22, 2017) describes a display device which utilizes four sub-pixels instead of three sub-pixels. One red, one green and two blue sub-pixels are used in each pixel, with the two blue sub-pixels emitting light with different spectra. The combination of the two blue spectra produces a light which has a favorable color coordinate.

SUMMARY OF INVENTION

The present invention relates to a blue quantum dot LED (QD-LED) that uses an electrically excited quantum dot layer and an optically excited quantum dot layer to emit light with an improved color, and in particular a color that substantially conforms to the Rec. 2020 specification, and does not contain highly toxic metal materials such as cadmium or lead. The improved color is achieved without external color filters, thereby enabling a display with a color gamut which more closely matches that of the Rec. 2020 specification.

In exemplary embodiments, blue light emitted from a first emissive layer is partially converted to a second spectrum of blue light by a second emissive layer, which may be a photoluminescent (PL) quantum dot (QD) layer. Using a second emissive layer to convert a portion of blue light from a first emissive layer into a second blue light spectrum advantageously produces a more favorable spectrum of overall blue light emitted from the QD-LED, which has a smaller value of Δu'v' relative to monochromatic 467 nm light compared to the unconverted emission spectrum of the first emissive layer. The partial conversion is achieved through the addition of a second QD material into the QD-LED layer structure which is optically pumped by the emission from the QDs of the first emission layer. Preferably, Δu'v'≤0.04, and more preferably Δu'v'≤0.02 and as low as Δu'v'≤0.01.

An aspect of the invention, therefore, is an enhanced light-emitting device that is configured to emit light, and particularly blue light, in accordance with the Rec. 2020 specification. In exemplary embodiments, the light emitting device includes a substrate; a first electrode disposed on the substrate between an outer surface of the light emitting device and the substrate; a second electrode disposed between the first electrode and the outer surface; a first emissive layer in electrical contact with the first electrode and the second electrode, wherein the first emissive layer includes quantum dots that emit light when electrically excited, and wherein the first emissive layer is associated with a first peak wavelength, $\lambda_1$; and a second emissive layer disposed between the first emissive layer and a viewing side of the light emitting device, wherein the second emissive layer is a photoluminescent layer that includes quantum dots that emit light when optically excited, and the second emissive layer is associated with a second peak wavelength, $\lambda_2$, different from the first peak wavelength. The second emissive layer operates to convert a portion of light emitted by the first emissive layer from the first peak wavelength to the second peak wavelength, such that the resultant overall emission is in accordance with the Rec. 2020 specification.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF DRAWINGS

FIG. 11 is a chromaticity diagram depicting the color gamut associated with embodiments of the present invention.

FIG. 12 is a schematic drawing depicting an exemplary display device including red, green, and blue pixels in accordance with embodiments of the current application.

DESCRIPTION OF EMBODIMENTS

Figure 1:
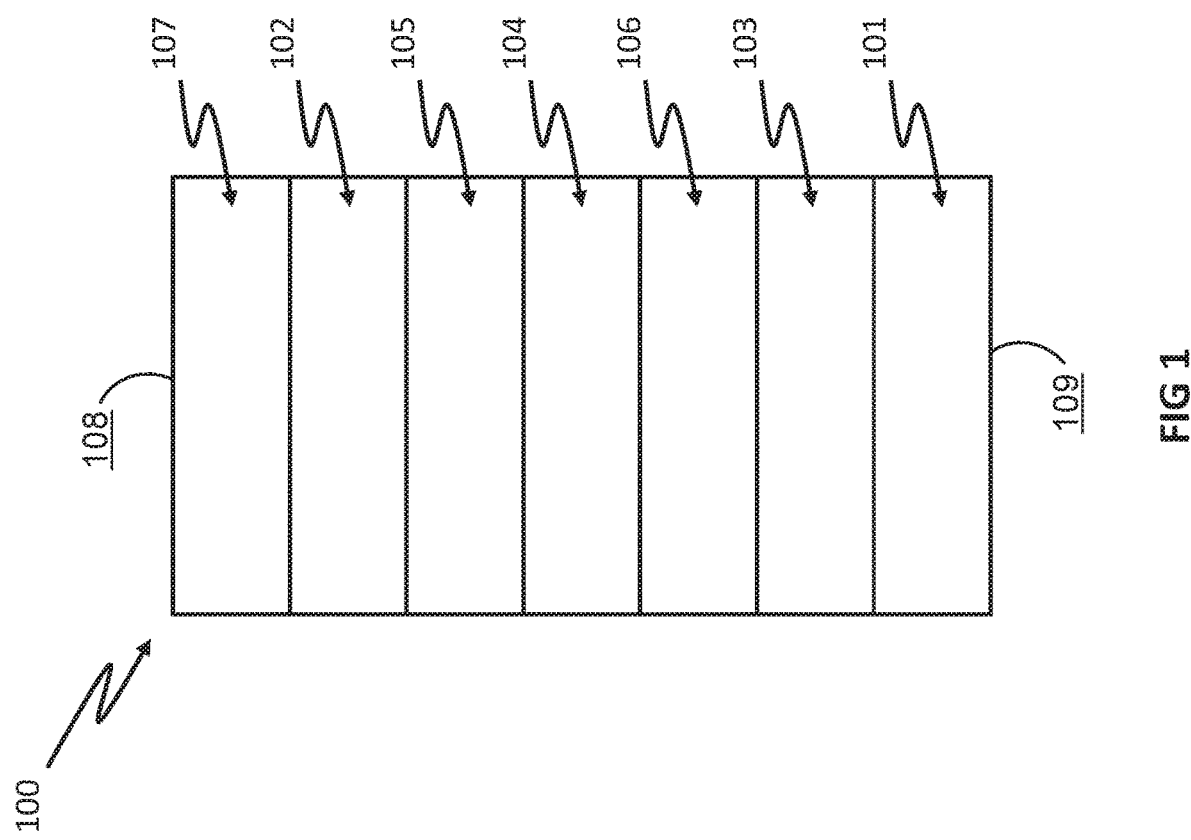
FIG. 1 is a schematic drawing depicting a conventional QD-LED structure.

Embodiments of the present invention will now be described with reference to the drawings, wherein like reference numerals are used to refer to like elements throughout. It will be understood that the figures are not necessarily to scale.

Conventional QD-LED

The advantages and enhancements of the present invention are understood by comparison to a conventional QD-LED structure. FIG. 1 shows a cross-section of a conventional QD-LED structure 100. A typical QD-LED structure 100 may include a stack of planar layers disposed on a substrate 101, with the layers including: two electrodes including a cathode 102 and an anode 103, an emissive layer (EML) 104, one or more charge transport layers (CTL) 105 between the cathode 102 and the EML 104, and one or more charge transport layers 106 between the anode 103 and the EML 104. The QD-LED structure has a top or outer surface 108 and a bottom surface 109 associated with the substrate 101.

During operation, a bias may be applied between the anode 103 and the cathode 102. The cathode 102 injects electrons into the adjacent CTL 105, and likewise, the anode 103 injects holes into the adjacent CTL 106. The electrons and holes propagate through the CTLs to the EML 104 where they radiatively recombine and light is emitted. The device as described with reference to FIG. 1 may be referred to as a "standard" structure, i.e., the anode 103 is closest to the substrate. The positions of the anode 103 and cathode 102 may be interchanged and the following description may be equally applicable to either structure. A device in which the cathode 102 is closest to the substrate 101 may be referred to as an "inverted" structure. A device in which light is emitted into air through the substrate 101 may be referred to as a "bottom emitter". A "bottom emitter" will have a viewing side associated with the bottom surface 109 of the QD-LED structure 100. A device in which light is emitted into air through the electrode further from the substrate 101 (the "top electrode") may be referred to as a "top emitter". A "top emitter" will have a viewing side associated with the top or outer surface 108 of the QD-LED structure 100. A thin-film encapsulation layer 107 may be applied to the top electrode such as cathode 102 to prevent oxygen and moisture ingress into the QD-LED structure 100.

The color of light emitted by any light-emitting device, including a QD-LED, may be evaluated by calculating its color coordinates, for example using coordinates (u', v') in the CIE LUV color space that is familiar to those of ordinary skill in the art. These coordinates are found by first calculating the tristimulus values X, Y and Z for the spectrum L(λ) according to:

$$X=\int_{380nm}^{780nm}L(\lambda)\bar{x}(\lambda)d\lambda;\ Y=\int_{380nm}^{780nm}L(\lambda)\bar{y}(\lambda)d\lambda;$$
$$Z=\int_{380nm}^{780nm}L(\lambda)\bar{z}(\lambda)d\lambda$$

where $\bar{x}$, $\bar{y}$ and $\bar{z}$ are the CIE color matching functions. The coordinates (u', v') are then given by:

$$u' = \frac{4X}{X+15Y+3Z};\ v' = \frac{9Y}{X+15Y+3Z}$$

The perceived color difference between two spectra of equal luminance, L and $L_0$, evaluated in the CIE LUV color space may then be quantified according to the parameter Δu'v', which is given by:

$$\Delta u'v'=\sqrt{(u'-u'_0)^2+(v'-v'_0)^2}.$$

QD-LED with Improved Color Coordinates

An aspect of the invention is an enhanced light-emitting device that is configured to emit light, and particularly blue light, with a color closer to that defined in the Rec. 2020 specification. In exemplary embodiments, the light emitting device includes a substrate; a first electrode disposed between a top or outer surface of the light-emitting device and the substrate; a second electrode disposed between the first electrode and a viewing side; a first emissive layer in electrical contact with the first electrode and the second electrode, wherein the first emissive layer includes quantum dots that emit light when electrically excited, and wherein the first emissive layer is associated with a first peak wavelength, $\lambda_1$; and a second emissive layer disposed between the first emissive layer and the viewing side of the light emitting device, wherein the second emissive layer is a photoluminescent layer that includes quantum dots that emit light when optically excited, and the second emissive layer is associated with a second peak wavelength, $\lambda_2$, different from the first peak wavelength. The second emissive layer operates to convert a portion of light emitted by the first emissive layer from the first peak wavelength to the second peak wavelength, such that the resultant overall emission is closer to the color defined by the Rec. 2020 specification than the emission from the first emissive layer.

Figure 2:
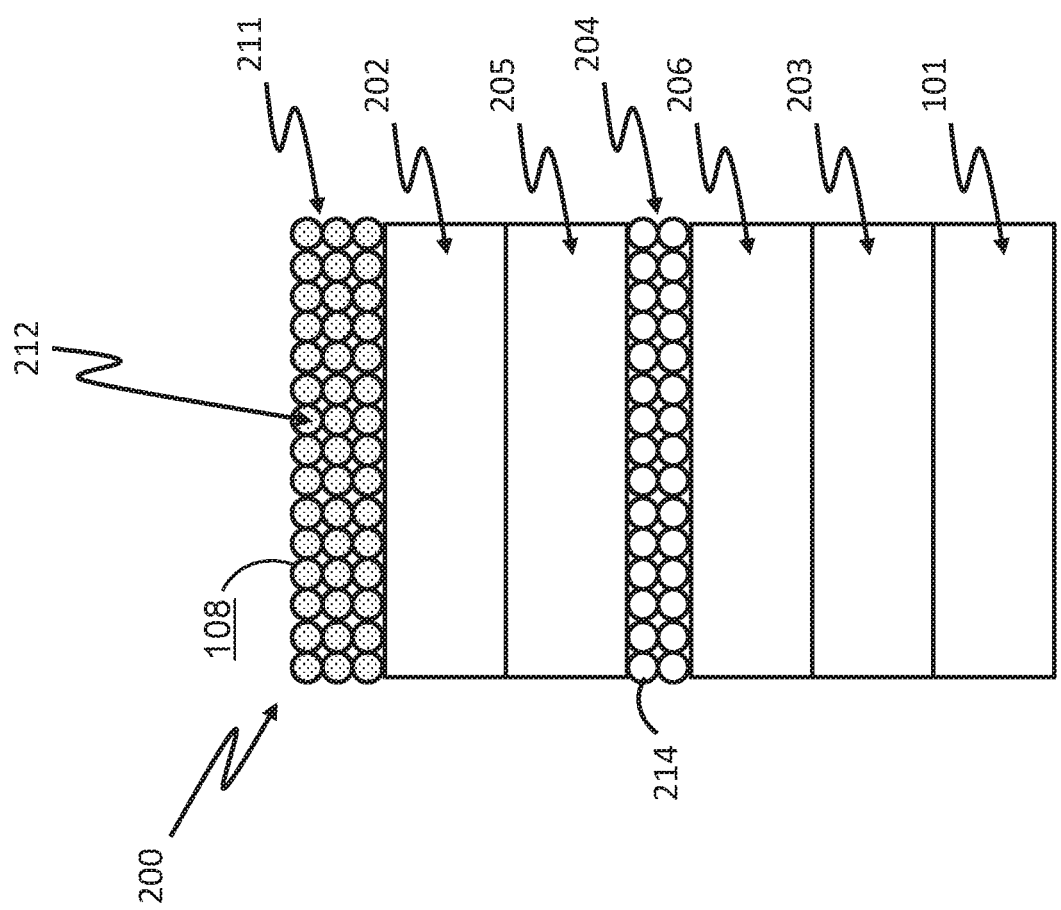
FIG. 2 is a schematic drawing depicting a QD-LED structure with a QD layer for improved color coordinates in accordance with embodiments of the present invention.

FIG. 2 is a schematic drawing depicting a QD-LED structure 200 with a QD layer for improved color coordinates in accordance with embodiments of the present invention. The QD-LED structure 200 includes a first electrode such as a highly reflective anode 203 disposed on the substrate 101, a second electrode coupled to the QD-LED structure 200 such as a semi-transparent or transparent cathode 202, a first emissive layer (EML) 204 disposed between the anode and cathode containing emissive nanoparticles 214, a hole transport layer (HTL) 206 between the anode 203 and the EML 204, an electron transport layer (ETL) 205 between the cathode 202 and the EML 204, and a second emissive layer (EML) 211 disposed between the cathode 202 and the top surface 108. In some embodiments, the highly reflective anode 203 may have a reflectivity greater than 80%. The semi-transparent or transparent cathode 202 may be characterized by a light transmissivity greater than 10%. As referenced above, principles of this invention also may be applied to inverted structures with the anode and cathode positions interchanged, and also to both top and bottom emitters with reflectivity and transmissivity of the pertinent layers being configured for the proper light emission direction.

The emissive nanoparticles 214 may be less than 20 nm in diameter. The emissive nanoparticles 214 may be quantum dots, quantum rods, and the like by which electrons and holes may recombine to emit light. In some embodiments, the EML 204 can include quantum dots comprising $ZnSe_xS_{1-x}$, where $0\leq x\leq1$, perovskites of the form $ABX_3$ where X is any halide, $Zn_wCu_zIn_{1-(w+z)}S$ where $0\leq w$, x, y, $z\leq1$ and $(w+z)\leq1$, carbon, and the like.

The EML 204 of the QD-LED structure 200 may include ZnSe, which has a toxicity far less than highly toxic metals such as cadmium or lead. In addition, the second EML 211 is configured to at least partially convert light from the first EML 204 to a second spectrum of light different from a first spectrum of light emitted by the first EML 204. For example, the second EML 211 may be a photoluminescent quantum dot (PL QD) layer including quantum dots 212. The QD-LED structure 200 including the second EML 211 produces a more favorable spectrum of light which has a smaller color difference value of Δu'v' relative to monochromatic 467 nm light as compared to the unconverted ZnSe emission spectrum of the first EML 204 by itself. To convert light from the EML 204 to the second spectrum of light, the PL QD layer 211 may be optically pumped or excited by the emission from the ZnSe QDs in the EML 204. In some embodiments, the color difference, Δu'v', may be less than or equal to 0.04, and more preferably Δu'v'≤0.01.

The use of quantum dots 212 for the photoluminescent material provides favorable properties for the second EML 211 including a sharp absorption edge and narrow emission spectrum. The light emitted by the photoluminescent material may not be reabsorbed by the ZnSe QDs in the first EML 204. Reabsorbed photons are not necessarily radiatively re-emitted, and therefore avoiding reabsorption advantageously increases device efficiency. Furthermore, quantum dots 212 have a small size and high absorption per unit length compared to conventional phosphor materials. This means that a shorter optical path length through the photoluminescent material is required for a given conversion of the light emitted by the ZnSe QDs. The high absorption per unit length permits the second EML 211 to be thinner as compared to conventional configurations and may reduce the overall thickness of the QD-LED structure 200. For example, conventional phosphor layers may be 10 µm to greater than 100 µm but the second EML 211 with quantum dots 212 may be as thin as 100 nm and up to 1 µm thick. In some embodiments, the high absorption per unit length by PL QDs may allow a lower phosphor concentration in the PL layer than conventional materials. The concentration of quantum dots 212 in the second EML 211 may depend on the thickness of the second EML 211 but, in some embodiments, may be 10 to 100 times lower than the concentration of conventional phosphor materials. The lower concentration allows the PL QDs to be mixed with another layer of the QD-LED structure 200 such as a charge transporting layer, e.g., ETL 205, without significantly affecting the electrical performance of the QD-LED.

Furthermore, the use of the PL QD layer 211 to generate the second spectrum of light may determine an intensity of the second spectrum of light, which is directly proportional to the intensity of the emission from the ZnSe QDs in the EML layer 204. For example, in the QD-LED structure 200, if the intensity of light associated with the ZnSe QDs of EML 204 is changed, then the intensity of light in the second spectrum emitted by the QDs in the PL QD layer 211 adjusts automatically to keep the relative intensities the same. The proportional change of the emitted light may reduce changes in the color coordinate of the combined emission. The change in intensity of the ZnSe QD emission spectrum from EML 204 could be intentional such as when different luminances are required from the QD-LED structure 200, or unintentional such as aging reducing the efficiency of the QD-LED structure 200. In both cases, the configuration of the various embodiments reduces unwanted color shift of the emitted light, and particularly, when the QD-LED structure 200 is used as the blue sub-pixel of a display device.

Furthermore, when the QD-LED structure 200 is used as the blue sub-pixel of a display device, a sharp absorption edge of the QDs in the PL QD layer 211 has an additional advantage. The sharp absorption edge ensures that light emitted from adjacent red or green sub-pixels is not absorbed and converted to blue light in the PL QD layer 211, which would negatively impact the color of light emitted by the red or green sub-pixels. By using a PL QD layer 211 which does not absorb red or green light, the layer may be deposited over the entire display device without the need for any patterning steps, thereby simplifying the manufacturing process.

Light emitted by the quantum dots in the first EML 204 may be emitted through the cathode 202, where such light is incident on the second EML 211. Some light is absorbed by PL quantum dots 212 in the second EML 211 and re-emitted with a longer wavelength than the absorbed light. Unconverted light from the quantum dots in the EML 204 and light emitted by the quantum dots 212 in the second EML 211 may be emitted from the QD-LED structure through the top surface 108. Therefore, the QD-LED structure 200 is a top-emitting QD-LED in this example. In some embodiments, the EML 204 may be associated with an emission spectrum in air with a first peak wavelength, $\lambda_1$, and the quantum dots of the second EML 211 may be associated with a second peak wavelength, $\lambda_2$ different from the first peak wavelength.

Figure 3:
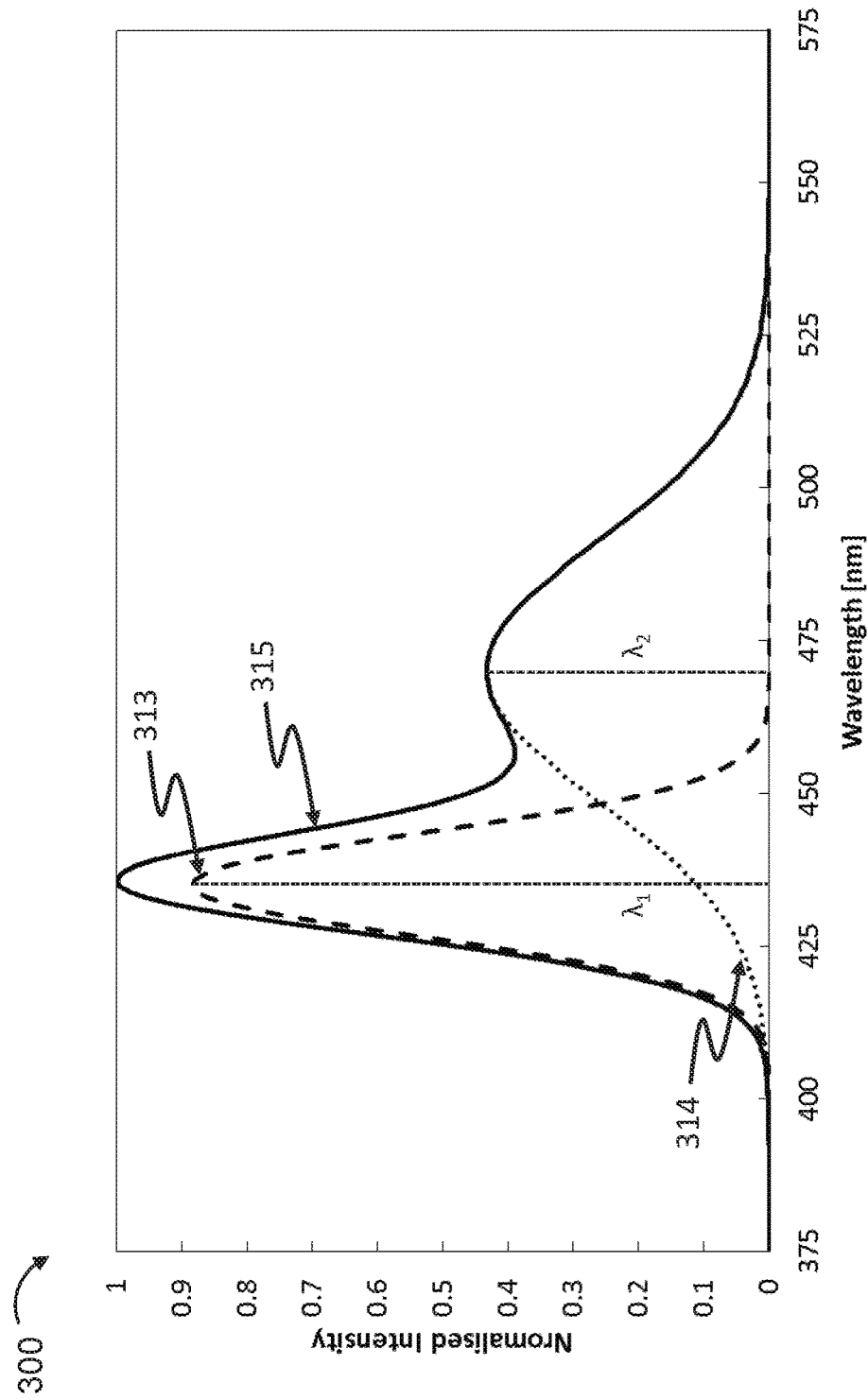
FIG. 3 is a drawing depicting an emission spectrum associated with the operation of the QD-LED of FIG. 2.

FIG. 3 is a drawing depicting an emission spectrum 300 associated with the operation of the QD LED structure 200 of FIG. 2. The emission spectrum 300 includes a first emission spectrum 313 associated with the quantum dots in the first EML layer 204, a second emission spectrum 314 associated with the quantum dots in the second EML PL QD layer 211, and a third emission spectrum 315 associated with the overall light emitted by the QD-LED structure 200. The quantum dots of the EML 204 may have a peak wavelength, $\lambda_1$, associated with a range of 405 nm 460 nm and a full-width at half-maximum (FWHM) less than 30 nm when electrically pumped or excited. Preferably, the peak emission wavelength in air may be in the range 435 nm 460 nm. Accordingly, the quantum dots of EML 204 of QED-LD structure 200 may be associated with the first emission spectrum 313. In an exemplary embodiment, the first emission spectrum 313 is Gaussian, the peak emission wavelength, $\lambda_1$, is 435 nm, and the FWHM is 20 nm.

The quantum dots of the PL QD layer 211 may have a peak wavelength in air, $\lambda_2$, in the range 460 nm$\leq\lambda_2\leq$490 nm and a FWHM$\leq$60 nm when optically pumped. Preferably, the peak emission wavelength in air may be in the range 460 nm$\leq\lambda_1\leq$480 nm and FWHM is $\leq$50 nm, and the FWHM may be 30 nm. In this example, the quantum dots of the PL QD layer 211 may be associated with the emission spectrum 314. In an exemplary embodiment, the PL QD layer 211 emission spectrum 314 is Gaussian, the peak emission wavelength, $\lambda_2$, is 470 nm and the FWHM is 50 nm. In some embodiments, the first peak wavelength, $\lambda_1$, and the second peak wavelength, $\lambda_2$, may be in a blue region of the visible spectrum. The blue region may include wavelengths from 405 nm to 490 nm.

The thickness of the PL QD layer 211 may be configured to determine or set an emission ratio of the spectrum emitted by the EML 204 relative to the emission spectrum of the PL QD layer 211 associated with the overall emission spectrum 315. In some embodiments, the thickness of the PL QD layer 211 is configured such that the emission ratio of the overall spectrum 315 comprises 45% from emission by the QDs in the EML 204 and 55% from emission by the QDs in the PL QD layer 211.

Figure 4:
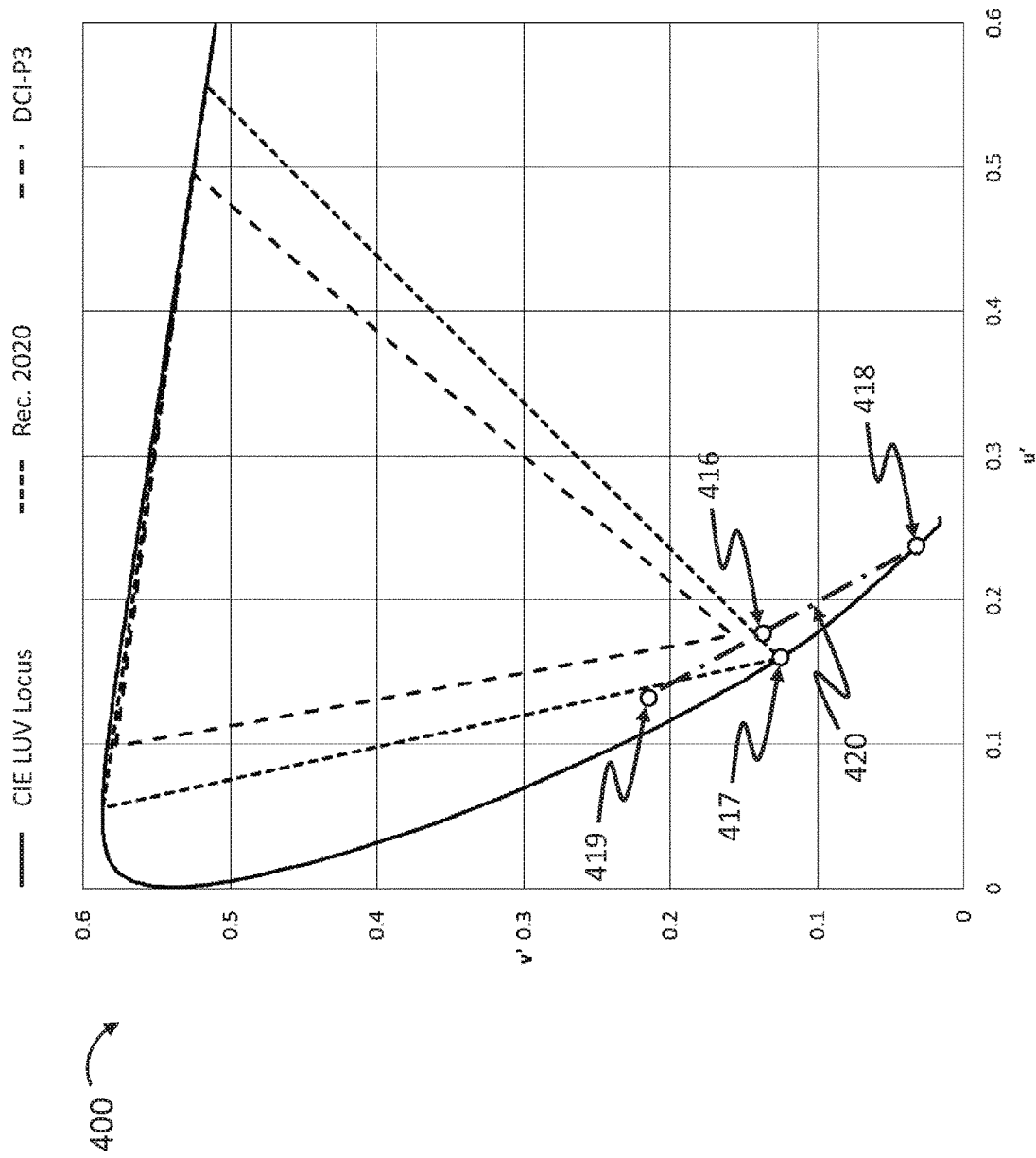
FIG. 4 is a chromaticity diagram depicting the color gamut associated with the operation of the QD-LEDs of FIGS. 1 and 2.

FIG. 4 is a chromaticity diagram 400 depicting the color gamut associated with the operation of an exemplary QD-LED associated with the characteristics described above. The chromaticity diagram 400 includes a color coordinate 416 associated with the overall blue light emitted by an exemplary QD-LED structure in which the QD-LED structure is configured comparably as QD-LED 200 of FIG. 2, a color coordinate of the Rec. 2020 blue primary 417 which may regarded as the desired color coordinate, a color coordinate 418 of the EML 204 of FIG. 2 by itself, and a color coordinate 419 of the PL QD layer 211 of FIG. 2 by itself. The emission ratio can be depicted on the chromaticity diagram 400 as a line 420 connecting the color coordinate 418 of the EML and the color coordinate 419 of the PL QD layer. The emission ratio with 45% emission from the EML 204 and 55% emission from the PL QD layer 211 may give a the QD-LED structure 200 the color coordinate 416 at (0.177, 0.137), and a perceived color difference value, $\Delta$u'v', of 0.020 when compared to the Rec. 2020 blue primary color coordinate 417 at (0.160, 0.126). This color difference $\Delta$u'v' value is advantageously reduced from 0.121 for emission arising solely from the QDs in the EML 204, which has the color coordinate 418 at (0.237, 0.032). The emission from the PL QD layer has a color coordinate 419 at (0.132, 0.215), and in combining the two emissions of the EML 204 and PL QD layer 211 in the manner described, the color coordinate 416 of the overall emission more closely approximates the desired Rec. 2020, particularly as associated with the blue light emission.

Furthermore, the narrow emission from quantum dots may keep the color coordinate of the emitted light close to the locus of the color space. The color coordinate 416 of the combination of the emitted light from the two QD materials lies on the line 420 between the color coordinates of the emission from each individual QD material. Therefore, keeping the color coordinates of the EML 204 and the PL QD layer 211 close to the CIE LUV locus advantageously allows the combined emission to have a color coordinate which is also close to the CIE LUV locus, on which the 467 nm monochromatic point is situated (i.e., the color coordinate of the Rec. 2020 blue primary 417).

While a 45%:55% ratio of EML 204 emission to PL QD layer 211 emission is used in this example, which minimizes $\Delta$u'v', other ratios could be attained by changing the thickness of the PL QD layer 211 as may be desirable for particular circumstances. For example, a 40%:60% ratio, which could be obtained by increasing the thickness of the PL QD layer 211, has a higher color difference value of 0.024 but when used in a display device, advantageously relaxes the peak wavelength and FWHM constraints of a green sub-pixel which produces a display with a color gamut covering 100% of the DCI-P3 color space. In addition, while QDs with a longer wavelength or larger FWHM PL emission will result in a larger, and therefore less desirable, color difference value, a combined spectrum that contains a higher proportion of light emitted by the QDs in the EML 204 will advantageously produce a QD-LED structure with a higher overall efficiency if the PL quantum yield of the QDs in the PL QD layer is less than 100%.

FIG. 4 depicts a chromaticity diagram for a QD-LED with a standard, top emitter structure as described with respect to FIG. 2. Comparable principles are equally applicable to a QD-LED structure with a highly reflective cathode disposed on the substrate and a semi-transparent or transparent anode opposite the cathode, i.e., an inverted QD-LED structure. One of ordinary skill in the art would recognize many variations, modifications, and alternatives using standard, inverted, top-emitting, and bottom-emitting structures that can be enhanced with the addition of a PL QD layer positioned appropriately for the given device structure.

Figure 5:
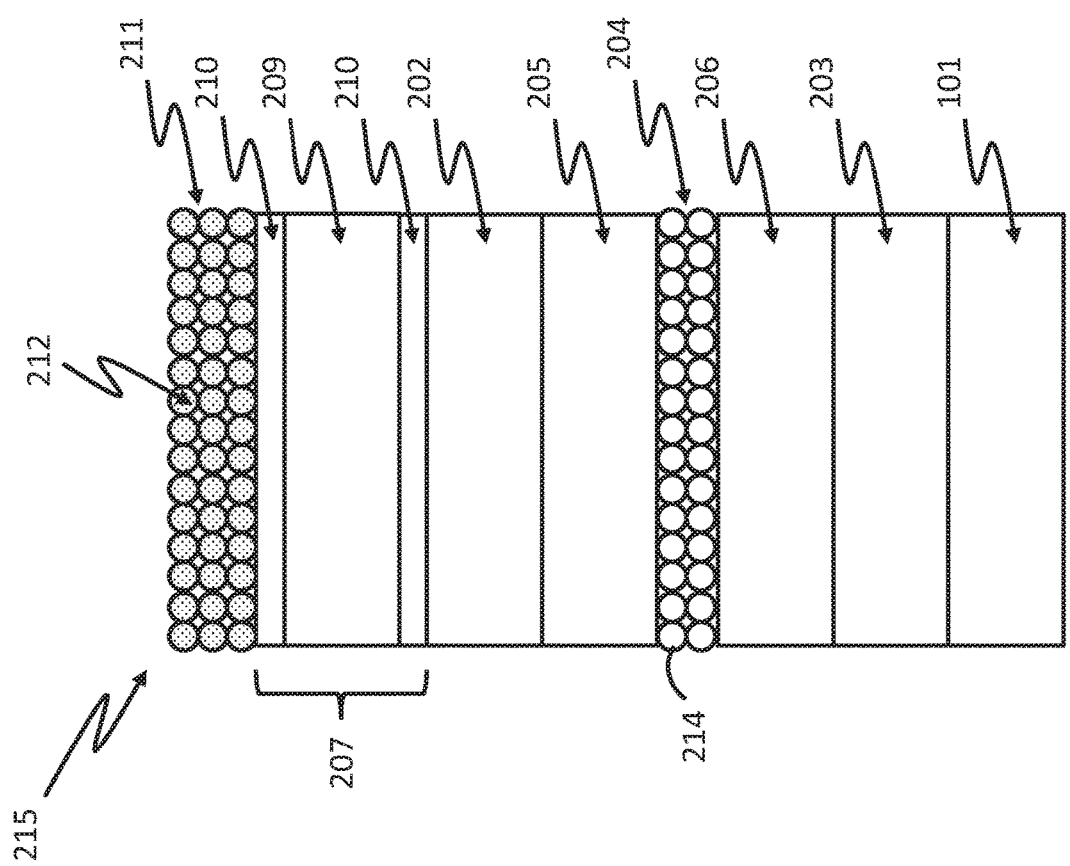
FIG. 5 is a schematic drawing depicting a QD-LED structure with a QD layer for improved color coordinates in accordance with embodiments of the present invention.

FIG. 5 is a schematic drawing depicting a QD-LED structure with a thin film encapsulation layer for improved color coordinates in accordance with embodiments of the present invention. The QD-LED structure 215 includes structures similar to the QD-LED structure 200 shown in FIG. 2, but further includes a thin film encapsulation layer 207 between the second electrode 202 and the second EML 211. Light emitted by the quantum dots in the first EML 204 may be emitted through the cathode 202 into the thin-film encapsulation layer 207, where such light is incident on the second EML 211. The thin film encapsulation layer 211 may include at least one organic layer 209 and may include at least one inorganic layer 210. The thin film encapsulation layer may improve the robustness of device by isolating the electrically active layers of the device from oxygen and moisture.

Figure 6:
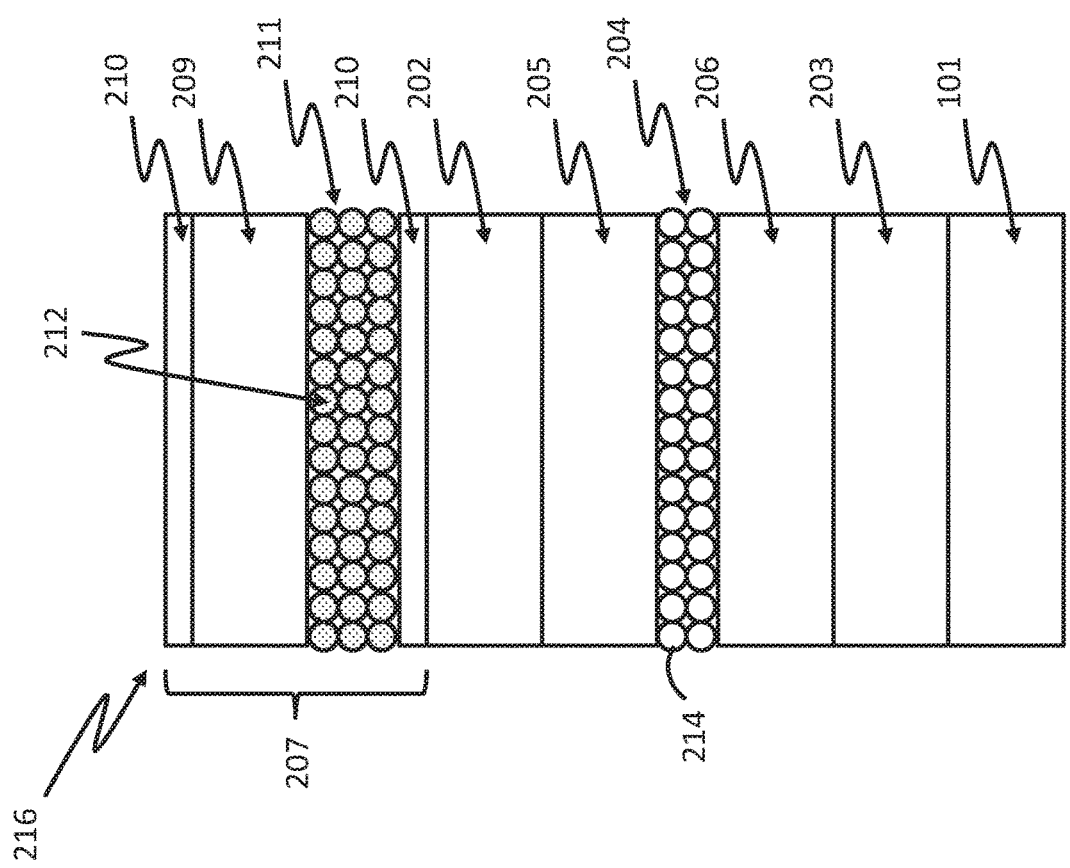
FIG. 6 is a schematic drawing depicting a QD-LED structure with a QD layer for improved color coordinates in accordance with embodiments of the present invention.

FIG. 6 is a schematic drawing depicting a QD-LED structure with a thin film encapsulation layer for improved color coordinates in accordance with embodiments of the present invention. The QD-LED structure 216 includes structures similar to the QD-LED structure 215 shown in FIG. 5, but places the second EML 211 within the thin film encapsulation layer 207, for example, between an organic layer 209 and an inorganic layer 210. Including the second EML 211 within the thin film encapsulation layer 207 keeps the electrically active layers and the second EML 211 isolated from oxygen and moisture. Isolating the second EML 211 from oxygen and moisture reduces the degradation of this layer. Encapsulating the electrically active layers and the second EML 211 reduces variation in the relative intensity of the light emitted from the first EML 204 and the second EML 211 over time, reducing color shift of the QD-LED 216, even if the intensity of the light emitted from the first EML 204 and the second EML 211 decreases over time.

Figure 7:
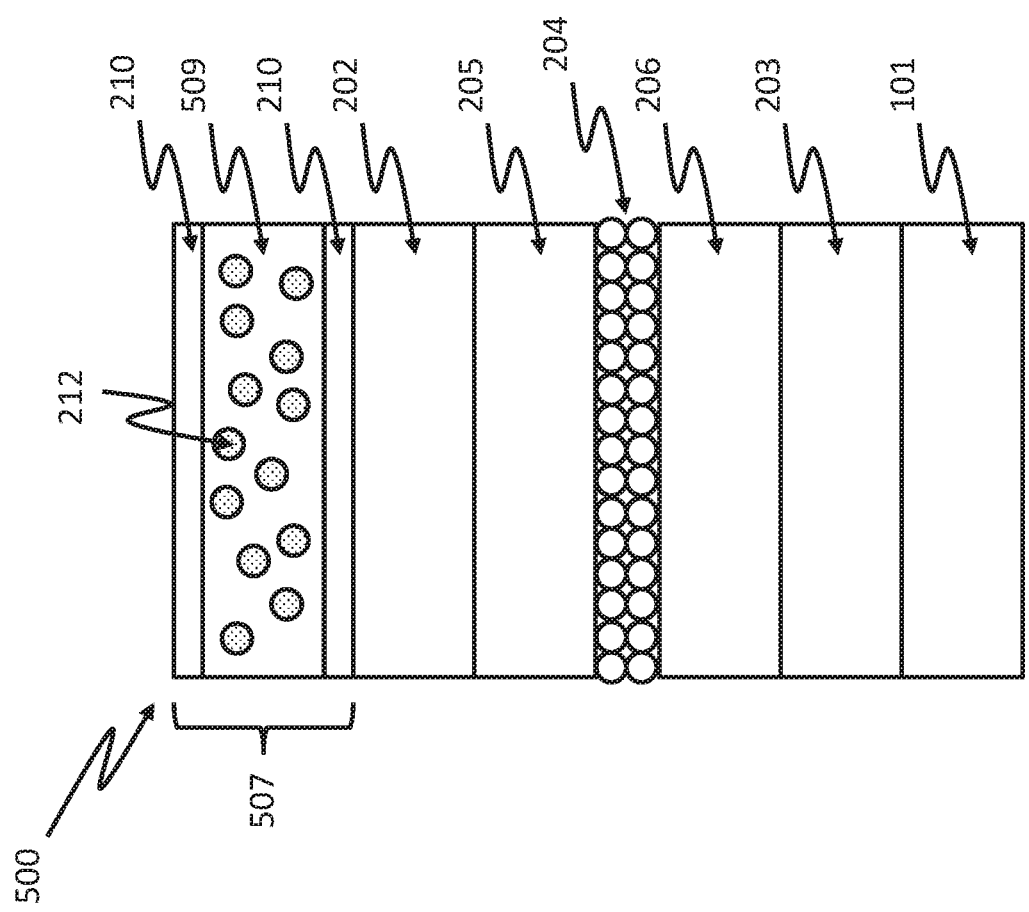
FIG. 7 is a schematic drawing depicting a QD-LED structure with a hybrid QD layer for improved color coordinates in accordance with embodiments of the present invention.

FIG. 7 is a schematic drawing depicting a QD-LED structure with a hybrid QD layer for improved color coordinates in accordance with embodiments of the present invention. The QD-LED structure 500 includes structures similar to the QD-LED structure 500 shown in FIG. 6 but eliminates the separate PL QD layer, second EML 211, and instead incorporates the PL quantum dots 212 into a hybrid organic layer 509 that is part of a thin film encapsulation layer 507. The QD-LED structure 500 also includes the highly reflective anode 203 disposed on the substrate 101, the cathode 202, the EML 204, the HTL 206, the ETL 205, and the thin film encapsulation layer 507 is deposited over the cathode 202.

The thin film encapsulation layer 507 of the QD-LED structure 500 includes the hybrid organic layer 509 including the PL QDs 212 and the at least one inorganic layer 210. The concentration of PL QDs 212 in the hybrid organic layer 509 is configured to give the desired emission ratio of EML 204 light emission to PL QD light emission from the QD-LED structure 500 comparably as described above in connection with FIG. 4. Including the PL QDs in the thin film encapsulation layer 507 may simplify fabrication by eliminating an additional step of deposition of a separate PL QD layer. Additionally, the use of a hybrid organic layer 509 to eliminate the need for a separate PL QD layer may result in reducing the overall thickness of the QD-LED structure 500.

Figure 8:
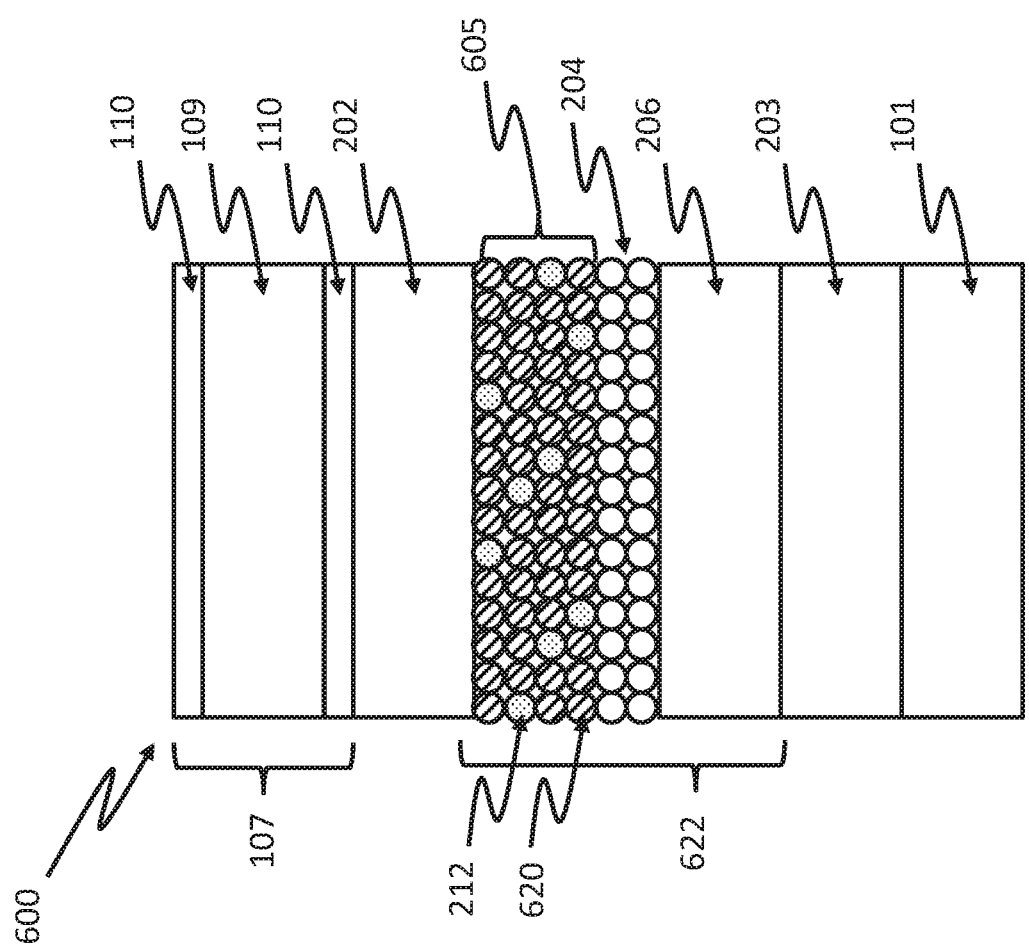
FIG. 8 is a schematic drawing depicting a QD-LED structure with a hybrid QD layer for improved color coordinates in accordance with embodiments of the present invention.

FIG. 8 is a schematic drawing depicting a QD-LED structure with a hybrid QD layer for improved color coordinates in accordance with embodiments of the present invention. The QD-LED structure 600 includes structures similar to the QD-LED structure 200 shown in FIG. 2, but eliminates the separate PL QD layer, the second EML 211, and instead incorporates the PL quantum dots 212 into one or more of the charge transport layers such as the HTL and/or the ETL. In some embodiments, the charge transport layer may be either an organic material or an inorganic material. In the example of FIG. 8, the QD-LED structure 600 includes a hybrid ETL 605 with the PL quantum dots 212 and metal oxide nanoparticles 620. The QD-LED structure 600 also includes the highly reflective anode 203 disposed on the substrate 101, the cathode 202, the EML 204, the HTL 206, and a thin film encapsulation layer 107 over the cathode 202.

QD-LED structure 600 eliminates the separate PL QD layer, the second EML 211, and by incorporating the PL QDs into a charge transport layer, achieves the advantages associated with the QD-LED structure 500 shown in FIG. 7 such as reduced manufacturing steps and no increase in QD-LED thickness in comparison with conventional QD-LED structures. Additionally, QD-LED structure 600 reduces the distance between the QDs in the EML 204 and the PL QDs 212 which enhances performance. In particular, QD-LED structure 600 moves the PL QDs 212 within the cavity structure 622 formed between the anode 203 and the cathode 202. In this way, the difference in an angular emission profile of the emission from the EML 204 QDs and the emission from the PL QDs 212 is reduced. The reduced distance between the QDs in the EML and the PL QDs 212 reduces the color shift as a function of viewing angle from the QD-LED structure 600.

Figure 9:
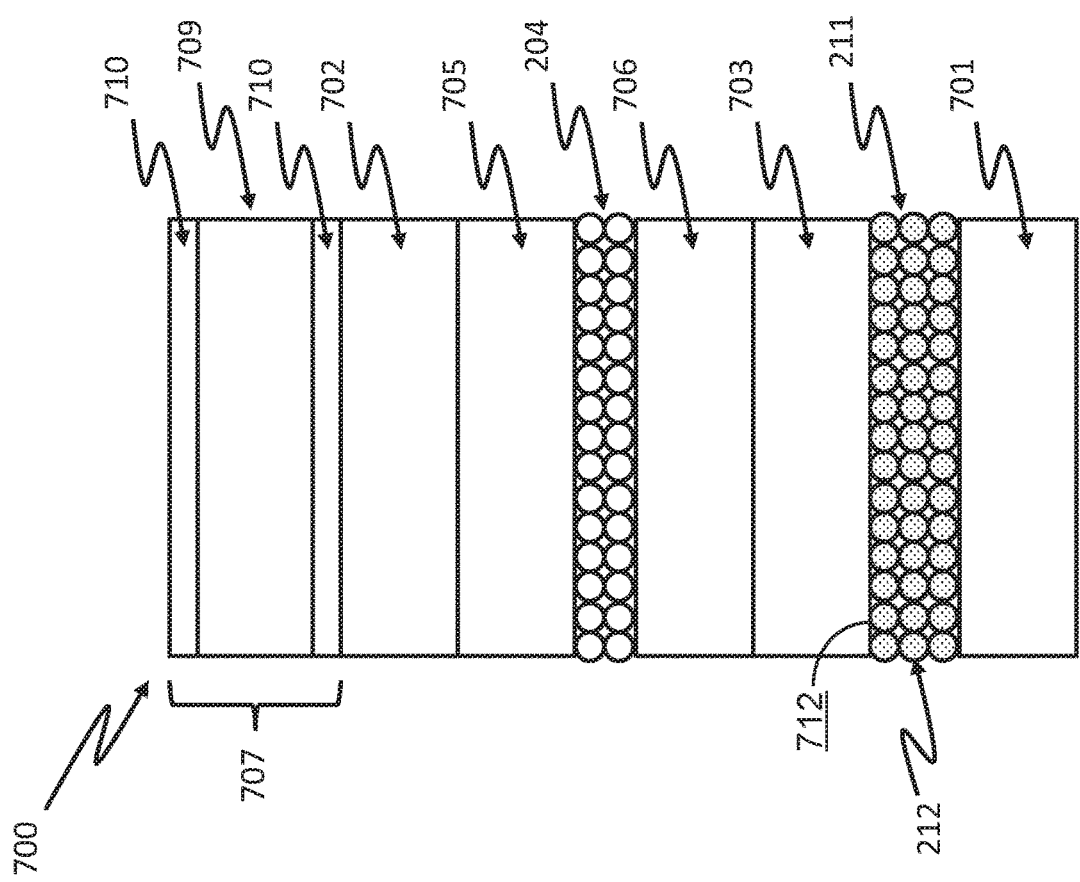
FIG. 9 is a schematic drawing depicting a QD-LED structure with a QD layer and a transparent substrate for improved color coordinates in accordance with embodiments of the present invention.

FIG. 9 is a schematic drawing depicting a QD-LED structure with a QD layer and a transparent substrate for improved color coordinates in accordance with embodiments of the present invention. The QD-LED structure 700 is configured as a bottom emitter referenced above that emits light through the transparent substrate 701. The QD-LED structure 700 further includes a semi-transparent or transparent anode 703, an HTL 706 between the anode 703 and the EML 204, an ETL 705 between the EML 204 and a reflective cathode 702, and a thin film encapsulation layer 707 that may include one or more organic layers 709 and one or more inorganic layers 710. In some embodiments, the anode 703 may have a light transmission greater than 10%, and the cathode 702 may have a reflectivity greater than 80%.

Because the QD-LED structure 700 is a bottom-emitter, the second EML 211 is situated between the anode 703 and the substrate 701. The anode 703 may be disposed on the second EML 211. Light emitted by the quantum dots in the EML 204 may be emitted through the anode 703 and may be incident on the PL quantum dots 212 in the second EML 211. Similarly as in previous embodiments but as adapted for a bottom emitter, a portion of light emitted by the quantum dots in the EML 204 may be absorbed by the PL quantum dots 212 in the second EML 211. The absorbed light causes the PL quantum dots 212 to emit light with a longer wavelength than the absorbed light. A second portion of light emitted by the quantum dots in the EML 204 is not absorbed and passes through the second EML 211 as unconverted light. Unconverted light from the quantum dots in the EML 204 and light emitted by the PL quantum dots 212 in the second EML 211 is emitted from the QD-LED structure 700 through the substrate 701. The PL QDs 212 may be mixed into an organic resin to create a second EML 211 in which the quantum dots 212 are contained within a matrix. The matrix facilitates deposition of the anode 203 and reduces degradation of PL quantum dots 212 during the fabrication of QD-LED structure 700. Alternatively, an organic resin may be disposed on top of the second EML 211 prior to deposition of the anode 703 to achieve the same improvements. The organic resin may form a planarization layer 712 to reduce the surface roughness and improve the quality of the subsequently deposited anode 703. One or more organic materials disclosed herein for the organic layer 709 may be suitable for the planarization layer 712.

Figure 10:
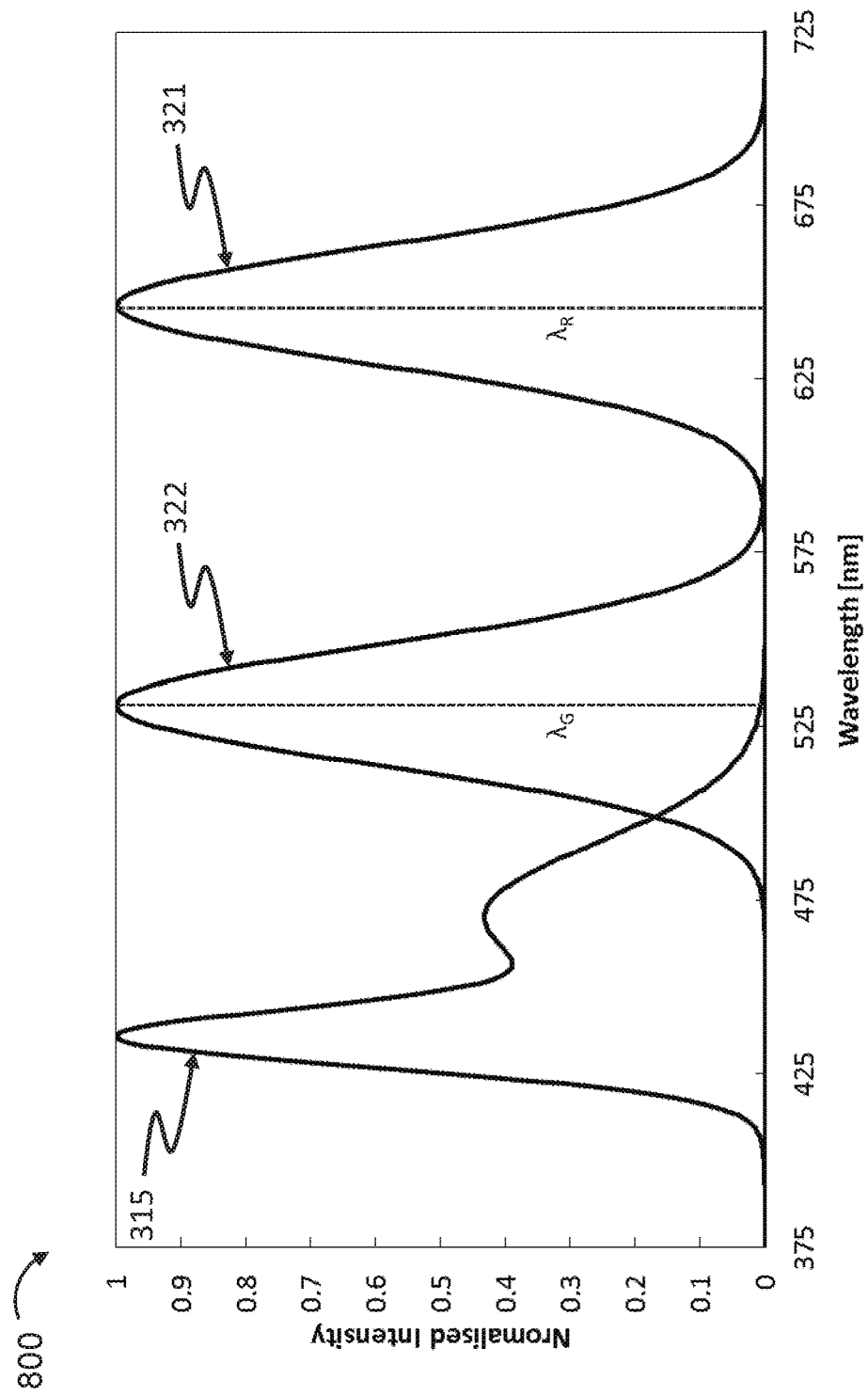
FIG. 10 is an emission spectrum associated with embodiments of the present invention.

FIG. 10 is an emission spectrum associated with light-emitting devices that are structured in accordance with embodiments of the present invention. The emission spectrum 800 depicts spectra associated with a plurality of light-emitting devices that emit light of different wavelengths, such as may be incorporated as part of a display system. The first emission spectrum 315 may be associated with a blue sub-pixel formed according to embodiments described herein, a second emission spectrum 321 may be associated with a red sub-pixel, and a third emission spectrum 322 may be associated with a green sub-pixel. In some embodiments, the red and green sub-pixels are also QD-LEDs. In exemplary embodiments, the blue QD-LED is formed according to either the QD-LED structure 600 for a top-emitting display, or the QD-LED structure 700 for a bottom-emitting display so as to utilize fewer layers for a thinner display system. In addition, QD-LED structure 600 and QD-LED structure 700 minimize the difference in angular emission profile between the emission from the EML QDs and the emission from the PL QDs. This produces a display in which the blue sub-pixel has the desirable property of low color shift as a function of viewing angle, by either keeping the PL QDs within the cavity of the top-emitting QD-LED structure 600 or by utilizing a bottom-emitting QD-LED structure 700 in which the effect of the cavity is reduced.

The emission spectrum 315 associated with the blue sub-pixel may correspond to the color coordinate (0.177, 0.137) described in FIG. 4. The red and green sub-pixels may be InP QD-LEDs which have emission spectra 321 and 322 with a Gaussian shape, peak wavelengths of, $\lambda_R$, approximately 646 nm and, $\lambda_G$, approximately 531 nm respectively, and FWHMs of approximately 40 nm. The emission spectrum 321 of the red sub-pixel may correspond to color coordinates of (0.557, 0.516), and the emission spectrum 322 of the green sub pixel may correspond to color coordinates of (0.069, 0.580).

Here, the term "InP QD" is used to refer to quantum dots that include any suitable InP-based material. Such InP QDs include, for example, QDs comprising an InP material or an InP-based core located within one or more shell layers, such as for example a zinc sulfide (ZnS) shell or zinc selenide (ZnSe) shell around an InP core. There may be grading between the core and shell materials at the interfaces. The QDs may comprise atomic or molecular ligands bound to the QDs. The InP materials further may include InP doped with another element, such as gallium and the like.

FIG. 11 is a chromaticity diagram 900 depicting the color gamut associated with embodiments of the present invention. The color gamut 902 of the display described in FIG. 8 is shown on the chromaticity diagram 900 by the blue color coordinate 416 from FIG. 4, a red color coordinate 904, and a green color coordinate 906. The color gamut 902 covers over 90% of the Rec. 2020 specification and 100% of the DCI-P3 specification. Without the PL quantum dot layer to shift the blue color coordinate, the blue sub-pixel would have a color coordinate 910 at (0.237, 0.032) and the color gamut of the display, illustrated by shaded area 912, would be only 82% of the Rec. 2020 specification. The color gamut 902 of the display according to the present disclosure increases the color gamut by the shaded area 914 to cover over 90% of the Rec. 2020 specification when the alternative CIE XYZ color space is used. Therefore, the various embodiments of the invention described herein enable a display which does not contain highly toxic materials, such as cadmium and lead, and achieves a large color gamut as compared to conventional displays.

FIG. 12 is a schematic drawing depicting an exemplary display device 1000 including red, green, and blue pixels in accordance with embodiments of the current application. In this example depiction, the reference numeral designation "a" denotes a portion of the display device corresponding to the blue pixel, the reference numeral designation "b" denotes a portion of the display device corresponding to the green pixel, and the reference numeral designation "c" denotes a portion of the display device corresponding to the red pixel. Generally, the blue pixel in particular is a light-emitting device structured in accordance with any of the embodiments in the present application described above with reference to FIGS. 2-11.

In the example as depicted in FIG. 12, the blue, green, and red pixels share a common substrate 101 on which patterned reflective anodes 203a, 203b, 203c are formed respectively as to each pixel. Each pixel is separated by an electrically insulating bank 1001 disposed on the substrate 101. The emissive layers 204a, 204b, and 204c of the pixels are configured to emit blue, green, and red light respectively by changing a property of the quantum dots. For example, the chemical composition of the quantum dots may be different between the emissive layers to generate the different colors of light, and/or the size of the core of the quantum dots may be different between the emissive layers to generate the different colors of light. The cathode 202 also is common to all pixels.

The thin-film encapsulation 207 similarly is commonly disposed on a viewing side of the blue, green, and red pixels. The thin-film encapsulation 207 includes a photoluminescent layer 211 including quantum dots configured to absorb the blue light emitted by the blue emissive layer 204a, and re-emit a portion of such light with a longer blue wavelength to generate an overall emission comparable to that denoted by blue waveform 315 of FIG. 10. Using quantum dots, which have a sharp absorption edge, advantageously means that the light emitted by the green emissive layer 204b and the red emissive layer 204c is not absorbed and remitted by the photoluminescent layer 211, preserving the color purity of the green and red light emitted by the green and red pixels. This beneficially means that the photoluminescent layer 211 may be disposed over the entire area of the display device 1000, removing the need for any patterning process thereby simplifying manufacture of the display device. The photoluminescent quantum dot layer 211 may be a discrete layer as shown in FIG. 12, or combined into one or more of the layers in the thin-film encapsulation, as described previously with reference to FIGS. 6 and 7. In the case that the electron transport layer is common to all pixels, the photoluminescent quantum dots may be combined into the electron transport layer to simplify manufacturing of the display device.

The hole transport layers 206a, 206b, and 206c may be the same material or different materials as to each pixel, and the electron transport layers 205a, 205b, and 205c may be the same material or different materials as to each pixel. Furthermore, while the electron transport layers shown here are separate layers for each pixel, it should be understood that this layer may be common to all pixels. In addition, while the display device 1000 in this example is configured as a top emitting device, it is understood that applying a common photoluminescent material under the anode of a bottom emitting device comparably as depicted in FIG. 9 achieves analogous advantages as the top emitting structure of FIG. 12.

The specific layers illustrated in FIGS. 2, 5-9, and 12 provide a particular arrangement of a QD-LED with improved color coordinates according to an embodiment of the present invention. Other layers or contacts may also be formed thereon according to alternative embodiments. Moreover, the individual device layers and components illustrated in FIGS. 2, 5-9, and 12 may include multiple sub-layers that may be formed in various arrangements as appropriate to any given individual device requirements. Furthermore, additional layers or components may be added or existing layers or components may be removed depending on the particular applications. One of ordinary skill in the art would recognize many variations, modifications, and alternatives.

The following provides some material composition examples of the layers in accordance with embodiments of the present invention. It will be appreciated that these examples are non-limiting. These examples are described principally in connection with the layer structure comparable to FIG. 7, although comparable materials may be used in accordance with the other embodiments.

The substrate may be a 1 mm glass substrate. The photoluminescent (PL) layer of quantum dots may include one or more of: InP, GaP, ZnSe, ZnS, carbon, and perovskites of the form $ABX_3$ where A may be a first cation, for example an alkaline earth metal, an alkali metal such as Cs, a short chain organic such as methylammonium ($CH_3NH_3$), and the like, B may be a second cation smaller than the first cation, for example a post-transition metal such as Pb or Sn, and the like, X may be any halide anion such as Cl, Br or I. In some embodiments, the quantum dots may be spin coated onto the substrate to form a second EML 211 as shown in FIG. 7, and the PL layer of quantum dots may be 100 nm thick.

In the example having a structure comparable to FIG. 7, an electrode may be formed on the PL layer. A transparent electrode may be formed with indium tin oxide (ITO), indium zinc oxide (IZO), indium gallium zinc oxide (IGZO), and the like. In some embodiments, a semi-transparent electrode may be formed with µg thinner than 30 nm, an Mg:Ag alloy in any ratio and thinner than 30 nm, a Ca/Ag bilayer with total thickness less than 30 nm, or any of the previous in combination with LiF thinner than 2 nm, $CsCO_3$ thinner than 2 nm, 8-quinolinolato lithium (Liq.) thinner than 2 nm, and the like. In some embodiments, the electrode may be a 100 nm thick ITO anode. The 100 nm of ITO may be sputtered onto the PL layer quantum dots through a shadow mask to define an anode region.

A charge transport layer may be formed on the electrode. In this particular example, the charge transport layer may be a hole transport layer (HTL) comprising one or more of $MoO_3$, $WO_3$, CuO, $Mg_{1-x}Ni_xO$ where $0 \leq x \leq 1$, $V_2O_5$, poly (3,4-ethylenedioxythiophene): poly(styrenesulfonate) (PEDOT:PSS), poly(9,9-dioctylfluorene-co-N-(4-sec-butylphenyl)-diphenylamine) (TFB), poly(9-vinylcarbazole) (PVK), poly(N,N'-bis(4-butylphenyl)-N,N'-bisphenylbenzidine) (PolyTPD), 4,4'-bis(N-carbazolyl)-1,1'-biphenyl (CBP), 2,3,5,6-tetrafluoro-7,7,8,8-tetracyanoquinodimethane (F4TCNQ), 1,4,5,8,9,11-hexaazatriphenylenehexacarbonitrile (HATCN), and the like. In some embodiments, an HTL may be formed on the QD-LED structure in two steps. First, aqueous PEDOT:PSS may be spin coated on top of the electrode and baked on a hotplate at 150° C. Second, TFB may be spin coated from chlorobenzene and baked on a hotplate at 110° C. The PDOT:PSS layer may be 45 nm and the TFB layer may be 35 nm.

The emissive layer then may be formed on the charge transport layer. The emissive layer may include quantum dots such as $ZnSe_xS_{1-x}$ where $0 \leq x \leq 1$; perovskites of the form $ABX_3$ where A may be a first cation, for example an alkaline earth metal, an alkali metal such as Cs, a short chain organic such as methylammonium ($CH_3NH_3$), and the like, B may be a second cation smaller than the first cation, for example a post-transition metal such as Pb or Sn, and the like, X may be any halide anion such as Cl, Br or I; $Zn_wCu_zIn_{1-(w+z)}S$ where $0 \leq w, x, y, z \leq 1$ and $(w+z) \leq 1$; carbon; and the like. In some embodiments, the emissive layer may be formed on the charge transport layer using ZnSe quantum dots. The ZnSe quantum dots may be spin coated from octane on the charge transport layer and baked on a hot plate at 60° C. The ZnSe emissive layer may be 20 nm.

A second charge transport layer then may be formed on the emissive layer. The second charge transport layer may be an electron transport layer (ETL). An ETL may be formed by ZnO; $Mg_{1-x}Zn_xO$ where $0 \leq x < 1$; $Al_{1-x}Zn_xO$ where $0 \leq x < 1$; $Li_{1-x}Zn_xO$ where $0 \leq x < 1$; $ZrO_2$; $TiO_2$; 2,2',2"-(1,3,5-benzinetriyl)-tris(1-phenyl-1-H-benzimidazole) (TPBi), and the like. In some embodiments, the ETL may be 60 nm thick and formed by $Mg_{0.15}Zn_{0.850}$ nanoparticles. The MgZnO nanoparticles may be spin coated from ethanol and baked on a hotplate at 80° C.

A second electrode then may be formed on the second charge transport layer. The second electrode may be a reflective electrode formed by Ag thicker than 30 nm, Al, and any of the previous electrode materials in combination with any transparent or partially reflective electrode material. In some embodiments, the reflective electrode may be a 100 nm Al cathode. The Al may be thermally evaporated through a shadow mask to provide a reflective cathode.

A thin film encapsulation layer then may be formed on the second electrode. The thin film encapsulation layer may include one or more inorganic layers and one or more organic layers. The inorganic layers may be formed by $SiO_2$, Silicon Nitride, aluminum oxide, and the like. The organic layers may be formed by one or more of acrylates; Parylene C; N,N'-Di(1-naphthyl)-N,N'-diphenyl-(1,1'-biphenyl)-4,4'-diamine (NPB); Tris(4-carbazoyl-9-ylphenyl)amine (TCTA); 4,4',4"-Tris[(3-methylphenyl)phenylamino] triphenylamine (m-MTDATA); and the like. In some embodiments, a hybrid organic layer may include quantum dot materials. In some embodiments, the thin film encapsulation layer may comprise a 30 nm $Al_2O_3$ layer, a 500 nm Parylene C, a second 30 nm $Al_2O_3$ layer, a second 500 nm Parylene C layer and a third 30 nm $Al_2O_3$ layer. The thin film encapsulation layers may be deposited by vacuum processes such as atomic layer deposition for the 30 nm inorganic aluminum oxide layers and chemical vapor deposition for the 500 nm organic polymer layers.

The specific material examples described above provide a particular method of fabricating a QD-LED with improved color coordinates according to an embodiment of the present invention. Other sequences of steps may also be performed according to alternative embodiments, and particularly may be adapted to form any suitable structure of light-emitting device including a standard structure, inverted structure, top emitting structure, and/or bottom emitting structure as may be suitable for any particular application.

An aspect of the invention, therefore, is an enhanced light-emitting device that is configured to emit light, and particularly blue light, in accordance with the Rec. 2020 specification. In exemplary embodiments, the light emitting device includes a substrate; a first electrode disposed on the substrate between an outer surface of the light emitting device and the substrate; a second electrode disposed between the first electrode and the outer surface; a first emissive layer in electrical contact with the first electrode and the second electrode, wherein the first emissive layer includes quantum dots that emit light when electrically excited, and wherein the first emissive layer is associated with a first peak wavelength, $\lambda_1$; and a second emissive layer disposed between the first emissive layer and a viewing side of the light emitting device, wherein the second emissive layer is a photoluminescent layer that includes quantum dots that emit light when optically excited, and the second emissive layer is associated with a second peak wavelength, $\lambda_2$, different from the first peak wavelength. The second emissive layer operates to convert a portion of light emitted by the first emissive layer from the first peak wavelength to the second peak wavelength, such that the resultant overall emission is in accordance with the Rec. 2020 specification. The light-emitting device may include one or more of the following features, either individually or in combination.

In an exemplary embodiment of the light emitting device, 405 nm$\leq\lambda_1\leq$490 and 405 nm$\leq\lambda_2\leq$490 nm.

In an exemplary embodiment of the light emitting device, the resultant emission from the light emitting device has a value of $\Delta u'v'\leq 0.04$ when compared to monochromatic light with wavelength 467 nm in the CIE 1976 LUV color space.

In an exemplary embodiment of the light emitting device, 405 nm$\leq\lambda_1\leq$460 nm and 460 nm$\leq\lambda_2\leq$490 nm.

In an exemplary embodiment of the light emitting device, a full width at half maximum (FWHM) of the light emitted by the first emissive layer is less than 30 nm, and the FWHM of the light emitted by the second emissive layer is less than 60 nm.

In an exemplary embodiment of the light emitting device, the second electrode is at least semi-transparent and the light emitting device is a top emitter.

In an exemplary embodiment of the light emitting device, the light emitting device further includes a thin film encapsulation layer disposed opposite of the substrate, wherein the thin film encapsulation layer further comprises: one or more inorganic thin film layers; and one or more organic thin film layers; wherein the quantum dots of the second emissive layer are disposed within at least one of the one or more organic thin film layers.

In an exemplary embodiment of the light emitting device, the light emitting device further includes a thin film encapsulation layer disposed opposite of the substrate, wherein the thin film encapsulation layer further comprises: one or more inorganic thin film layers; one or more organic thin film layers; and the second emissive layer is disposed in physical contact with one or more of the thin film layers.

In an exemplary embodiment of the light emitting device, the second emissive layer is disposed between the substrate and the first electrode and the light emitting device is a bottom emitter.

In an exemplary embodiment of the light emitting device, the light emitting device further includes a photoluminescent layer with a first quantum dot material associated with a first charge transport layer coupled to the first electrode; and a second charge transport layer coupled to the emissive layer.

In an exemplary embodiment of the light emitting device, the first emissive layer includes a first quantum dot material.

In an exemplary embodiment of the light emitting device, the second emissive layer includes a second quantum dot material different from the first quantum dot material.

In an exemplary embodiment of the light emitting device, the first quantum dot material comprises zinc selenide and the second quantum dot material comprises indium phosphide.

In an exemplary embodiment of the light emitting device, the second emissive layer is a charge transport layer.

In an exemplary embodiment of the light emitting device, the charge transport layer constituting the second emissive layer further includes metal oxide nanoparticles.

In an exemplary embodiment of the light emitting device, the light emitting device includes a substrate; a reflective anode disposed on the substrate; a transparent cathode coupled to the reflective anode; an emissive layer disposed between the reflective anode and the transparent cathode, wherein the emissive layer contains emissive nanoparticles associated with a first peak wavelength, $\lambda_1$; and a photoluminescent (PL) quantum dot (QD) layer associated with a second peak wavelength, $\lambda_2$, disposed between the emissive layer and the emitting surface; wherein the first peak wavelength and the second peak wavelength are in a blue region of a visible spectrum.

In an exemplary embodiment of the light emitting device, the light emitting device further includes a thin film encapsulation layer coupled to the transparent cathode with an emitting surface, wherein the thin film encapsulation layer further comprises a plurality of thin film layers including: one or more inorganic thin film layers; and one or more organic thin film layers; wherein the PL QD layer is disposed in physical contact with one or more of the plurality of thin film layers.

In an exemplary embodiment of the light emitting device, the light emitting device further includes a thin film encapsulation layer coupled to the transparent cathode with an emitting surface, wherein the thin film encapsulation layer further comprises: one or more inorganic thin film layers; and one or more organic thin film layers; wherein the PL QD layer is disposed within at least one of the one or more organic thin film layers.

In an exemplary embodiment of the light emitting device, the light emitting device further includes an electron transport layer disposed between the emissive layer and the transparent cathode; and a hole transport layer disposed between the emissive layer and the reflective anode.

In an exemplary embodiment of the light emitting device, the PL QD layer is disposed within a cavity formed between the reflective anode and the transparent cathode.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

INDUSTRIAL APPLICABILITY

Embodiments of the present invention relate to configurations of display devices. The display devices may include both a quantum dot emitting layer and a photoluminescent quantum dot layer. The display devices may include, but are not limited to, mobile phones, smartphones, personal digital assistants (PDAs), tablet and laptop computers, and televisions and monitors. Principles of the present invention in particular are applicable to display devices that are intended to meet the requirements of Rec. 2020 for ultra-high-definition televisions.

REFERENCE SIGNS LIST

100 QD-LED
101 Substrate
102 Top electrode
103 Bottom electrode
104 Emissive layer (EML)
105 Charge transport layer (CTL)
106 Charge transport layer (CTL)
107 Thin film encapsulation
108 Top or outer surface of LED
109 Bottom surface of LED
200 QD-LED Structure with photoluminescent layer
202 Semi-transparent cathode
203/203a-c Reflective anode
204/204a-c Emissive layer
205/205a-c Electron transport layer
206/206a-c Hole transport layer
207 Thin Film Encapsulation layer
209 Organic thin film encapsulation layer
210 Inorganic thin film encapsulation layer
211 Photoluminescent quantum dot layer
212 Photoluminescent quantum dots
214 Emissive nanoparticles
215 QD-LED structure with photoluminescent layer
216 QD-LED structure with photoluminescent layer
300 Emission Spectrum
313 EML QD emission spectrum
314 PL QD emission spectrum
315 Combined EML and PL QD emission spectrum of a blue sub-pixel
321 Emission spectrum of a red sub-pixel
322 Emission spectrum of a green sub-pixel
400 Chromaticity Diagram
416 Color coordinate of combined EML and PL QD emission
417 Color coordinate of Rec. 2020 blue primary
418 Color coordinate of EML QD emission
419 Color coordinate of PL QD emission
420 Emission Ratio Line
500 QD-LED Structure with photoluminescent layer
507 Hybrid thin film encapsulation layer
509 Hybrid Organic thin film encapsulation layer
600 QD-LED Structure with photoluminescent layer
605 Hybrid charge transport layer
620 Metal oxide nanoparticle
622 QD-LED cavity
700 QD-LED Structure with photoluminescent layer
701 Transparent substrate
702 Reflective cathode
703 Semi-transparent anode
705 Electron Transport layer
706 Transparent hole transport layer
707 Thin film encapsulation layer
709 One or more organic layers
710 One or more inorganic layers
712 Planarization layer
800 Emission Spectrum
900 Chromaticity Diagram
902 Color Gamut of QD-LED display device
904 Color coordinate green sub-pixel
906 Color coordinate red sub-pixel
910 Color coordinate of EML QD emission
912 Region of Rec. 2020 specification covered by QD-LED displays without this invention.
914 Additional region of Rec. 2020 specification covered by QD-LED display with this invention.
1000 Display device
1001 Bank

What is claimed is:

1. A display device comprising red, green, and blue pixels, wherein each of the blue pixel comprises a light emitting device comprising:
a substrate;
a first electrode disposed on the substrate between an outer surface of the light emitting device and the substrate;
a second electrode disposed between the first electrode and the outer surface; and
a first emissive layer in electrical contact with the first electrode and the second electrode, wherein the first emissive layer includes quantum dots that emit light when electrically excited, and wherein the first emissive layer is associated with a first peak wavelength, $\lambda_1$;
wherein a thin film encapsulation layer is disposed opposite of the substrate relative to the first emissive layer and having a viewing side surface and a non-viewing side surface, wherein the thin film encapsulation layer comprises one or more inorganic thin film layers and one or more organic thin film layers, and a second emissive layer disposed between the viewing side surface and the non-viewing side surface of the thin film encapsulation layer:
wherein the second emissive layer is a photoluminescent layer that includes quantum dots that emit light when optically excited, and the second emissive layer is associated with a second peak wavelength, $\lambda_2$, different from the first peak wavelength;
wherein the second emissive layer operates to convert a portion of light emitted by the first emissive layer from the first peak wavelength to the second peak wavelength; and
wherein thin film encapsulation layer comprises a viewing side inorganic thin film layer and a non-viewing side inorganic thin film layer, an organic thin film layer located between the viewing side inorganic thin film layer and the non-viewing side inorganic thin film layer, and the second emissive layer is located between the non-viewing side inorganic thin film layer and the organic thin film layer; and wherein the green and red pixels are quantum dot light-emitting diodes, and the blue, green, and red pixels share a common thin film encapsulation layer including the second emissive layer; and wherein the second emissive layer extends over the blue, green, and red pixels.

2. The display device of claim 1, wherein 405 nm≤λ1≤490 and 405 nm≤λ2≤490 nm.

3. The display device of claim 1, wherein a resultant emission from the light emitting device has a value of Δu'v'≤0.04 when compared to monochromatic light with wavelength 467 nm in the CIE 1976 LUV color space.

4. The display device of claim 1, wherein 405 nm≤λ1≤460 nm and 460 nm≤λ2≤490 nm.

5. The display device of claim 1, wherein a full width at half maximum (FWHM) of the light emitted by the first emissive layer is less than 30 nm, and the FWHM of the light emitted by the second emissive layer is less than 60 nm.

6. The display device of claim 1, wherein the second electrode is at least semi-transparent and the light emitting device is a top emitter.

7. The display device of claim 1, wherein the quantum dots of the second emissive layer are disposed within at least one of the one or more organic thin film layers.

8. The display device of claim 1, wherein the first emissive layer includes a first quantum dot material.

9. The display device of claim 8, wherein the second emissive layer includes a second quantum dot material different from the first quantum dot material.

10. The display device of claim 9, wherein the first quantum dot material comprises zinc selenide and the second quantum dot material comprises indium phosphide.

11. The display device of claim 1, further comprising:
a first charge transport layer coupled to the first emissive layer and in electrical contact with the first electrode; and
a second charge transport layer coupled to the first emissive layer and in electrical contact with the second electrode.

12. The display device of claim 11, wherein the first charge transporting layer or the second charge transporting layer includes metal oxide nanoparticles.

13. The display device of claim 1, wherein the second emissive layer is located between one of the inorganic thin film layers and one of the organic thin film layers.

14. The display device of claim 1, further comprising electrically insulating banks between adjacent pixels.

15. The display device of claim 1, wherein the substrate is a common substrate of the blue, green, and red pixels.

16. The display device of claim 1, wherein the second electrode is a common second electrode of the blue, green, and red pixels.

* * * * *